US010288926B2

(12) United States Patent
Tae et al.

(10) Patent No.: US 10,288,926 B2
(45) Date of Patent: May 14, 2019

(54) DISPLAY DEVICE

(71) Applicant: Samsung Display Co., Ltd., Yongin-si, Gyeonggi-do (KR)

(72) Inventors: Chang Il Tae, Seoul (KR); Joo Lark Son, Yongin-si (KR); Seung Jun Yu, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/868,876

(22) Filed: Jan. 11, 2018

(65) Prior Publication Data

US 2018/0224694 A1 Aug. 9, 2018

(30) Foreign Application Priority Data

Feb. 7, 2017 (KR) .................. 10-2017-0016867

(51) Int. Cl.
  *G02F 1/1335* (2006.01)
  *G02F 1/1368* (2006.01)
  *H01L 27/12* (2006.01)
  *H01L 51/52* (2006.01)
  (Continued)

(52) U.S. Cl.
  CPC ...... *G02F 1/133512* (2013.01); *G02F 1/1368* (2013.01); *G02F 1/133514* (2013.01); *H01L 27/124* (2013.01); *H01L 27/1225* (2013.01); *H01L 27/3211* (2013.01); *H01L 29/7869* (2013.01); *H01L 29/78618* (2013.01); *H01L 51/5284* (2013.01); *H01L 27/322* (2013.01); *H01L 27/3262* (2013.01)

(58) Field of Classification Search
  CPC ......... G02F 1/133512; G02F 1/133514; G02F 1/1368; H01L 27/1225; H01L 27/124; H01L 27/322; H01L 27/3262; H01L 29/78618; H01L 29/7869; H01L 51/5284
  See application file for complete search history.

(56) References Cited

U.S. PATENT DOCUMENTS 9,829,755 B1 11/2017 Tae et al.
2009/0115933 A1* 5/2009 Mimura ............ G02F 1/133512
                                                        349/59

(Continued)

FOREIGN PATENT DOCUMENTS

JP       2006276580 A  * 10/2006
KR   10-2010-0016992 A    2/2010

(Continued)

*Primary Examiner* — Sitaramarao S Yechuri
(74) *Attorney, Agent, or Firm* — Innovation Counsel LLP

(57) ABSTRACT

A display device may include a black member, a first pixel and a second pixel. The black member may have a first boundary and a second boundary in a plan view of the display device. The first boundary may include a first arc and may be surrounded by the second boundary. The first pixel may include a first pixel electrode, may display a first color, may be positioned in a first pixel column of the display device, and may be intersected by the first arc in the plan view of the display device. The second pixel may include a second pixel electrode, may display a second color different from the first color, may immediately neighbor the first pixel, may be positioned in the first pixel column of the display device, and may be spaced from the first boundary in the plan view of the display device.

20 Claims, 12 Drawing Sheets

(51) Int. Cl.
*H01L 29/786* (2006.01)
*H01L 27/32* (2006.01)

(56) References Cited

U.S. PATENT DOCUMENTS

| | | | | |
|---|---|---|---|---|
| 2009/0309813 A1* | 12/2009 | Fujita | ................ | G02F 1/133512 |
| | | | | 345/55 |
| 2010/0020277 A1* | 1/2010 | Morita | .............. | G02F 1/133512 |
| | | | | 349/110 |
| 2010/0091215 A1* | 4/2010 | Fukunaga | ............ | C09K 11/664 |
| | | | | 349/61 |
| 2010/0214195 A1* | 8/2010 | Ogasawara | ....... | G02F 1/136286 |
| | | | | 345/55 |
| 2010/0289994 A1* | 11/2010 | Nonaka | ............. | G02F 1/133514 |
| | | | | 349/108 |
| 2014/0217411 A1* | 8/2014 | Jiang | .................... | H01L 27/124 |
| | | | | 257/59 |
| 2016/0141344 A1* | 5/2016 | Sato | ........................ | H01L 27/32 |
| | | | | 257/40 |

FOREIGN PATENT DOCUMENTS

| | | | |
|---|---|---|---|
| KR | 10-1652016 B1 | 8/2016 | |
| KR | 20170126051 A | 11/2017 | |
| KR | 10-2018-0041797 A | 4/2018 | |

\* cited by examiner

DISPLAY DEVICE

CROSS-REFERENCE TO RELATED APPLICATION

This application claims priority to Korean Patent Application No. 10-2017-0016867 filed on Feb. 7, 2017 in the Korean Intellectual Property Office, and all the benefits accruing therefrom under 35 U.S.C. 119; the contents of the Korean Patent Application are herein incorporated by reference.

BACKGROUND

1. Technical Field

The technical field relates to a display device.

2. Description of the Related Art

There are various types of display devices, such as a liquid crystal displays and organic light emitting displays.

A liquid crystal display may include field generating electrodes and may include a liquid crystal layer interposed between the field generating electrodes. The liquid crystal display may display an image by applying a voltage to the field generating electrodes to generate an electric field in a liquid crystal layer, for determining alignment of liquid crystal molecules in the liquid crystal layer to control transmission of incident light.

An organic light emitting display may include organic light emitting devices that generate lights by recombination of electrons and holes. Images are displayed through combinations of lights generated by the organic light emitting devices.

SUMMARY

Embodiments may be related to a display device with minimum undesirable staircase phenomena at a boundary between a display area and a non-display area.

Embodiments may prevent green pixels positioned at the edge of the display region from being excessively conspicuous.

An embodiment may be related to a display device. The display device may include the following elements: a display area having a round shape; a black matrix disposed outside the display area; a first pixel at least partially overlapping the black matrix; and a second pixel arranged in the same column as the first pixel and not overlapping the black matrix. The first pixel and the second pixel may display different colors.

An embodiment may be related to a display device. The display device may include the following elements: a display area having a round shape; a black matrix disposed outside the display area; a first pixel group having a first pixel and a second pixel which at least partially overlap the black matrix; and a second pixel group having a third pixel and a fourth pixel which do not overlap the black matrix. The first pixel may be arranged in the same column as the third pixel, and the second pixel is arranged in the same column as the fourth pixel, and wherein the first pixel and the third pixel may display different colors, and the second pixel and the fourth pixel display the same color.

An embodiment may be related to a display device. The display device may include a black member, a first pixel and a second pixel. The black member may have a first boundary and a second boundary in a plan view of the display device. The first boundary may include a first arc and may be surrounded by the second boundary. The first pixel may include a first pixel electrode, may display a first color, may be positioned in a first pixel column of the display device, and may be intersected by the first arc in the plan view of the display device. The second pixel may include a second pixel electrode, may display a second color different from the first color, may immediately neighbor the first pixel, may be positioned in the first pixel column of the display device, and may be spaced from the first boundary in the plan view of the display device.

A luminance of the first color may be higher than a luminance of the second color.

The first pixel may display a green color.

The second pixel may display one of a red color and a blue color.

The display device may include the following elements: a substrate on which the first pixel and the second pixel are disposed; a first color filter overlapping the first pixel electrode in a direction vertical to the substrate; and a second color filter overlapping the second pixel electrode in the direction vertical to the substrate. The first color filter may partially overlap the black member in the direction vertical to the substrate.

The second color filter may not overlap the black member in the direction vertical to the substrate.

The first boundary may further include a second arc opposite the first arc.

The display device may include the following elements: a third pixel including a third pixel electrode, positioned in a second pixel column of the display device, and intersected by the second arc in the plan view of the display device; and a fourth pixel including a fourth pixel electrode, immediately neighboring the third pixel, positioned in the second pixel column of the display device, and spaced from the first boundary in the plan view of the display device.

A luminance of a color displayed by the third pixel may be higher than a luminance of a color displayed by the fourth pixel.

The third pixel may display a green color. The fourth pixel may display one of a red color and a blue color.

The third pixel and the fourth pixel may display a same color.

The display device may include the following elements: a fifth pixel positioned in a third column of the display device and intersected by the first boundary in the plan view of the display device; and a sixth pixel immediately neighboring the fifth pixel, arranged in the third column of the display device, and completely exposed by the black member in the plan view of the display device. The fifth pixel and the sixth pixel may display the same color.

An embodiment may be related to a display device. The display device may include a black member, a first pixel, a second pixel, a third pixel, and a fourth pixel. The black member may have a first boundary and a second boundary in a plan view of the display device. The first boundary may include a first arc, may include a second arc, and may be surrounded by the second boundary. The first pixel may include a first pixel electrode, may be positioned in a first pixel column of the display device, and may be intersected by the first curves section in the plan view of the display device. The second pixel may include a second pixel, may be positioned in a second pixel column of the display device, and may be intersected by the second arc in the plan view of the display device. The third pixel may include a third pixel electrode, may immediately neighbor the first pixel, may be positioned in the first pixel column of the display device, and may be spaced from the first boundary in the plan view of the display device. The fourth pixel may include a fourth pixel electrode, may immediately neighbor the second pixel, may be positioned in the second pixel column of the display device, and may be spaced from the first boundary.

The first pixel and the third pixel may display different colors. The second pixel and the fourth pixel may display a same color.

The first pixel and the third pixel may display a same color. The second pixel and the fourth pixel may display different colors.

The first pixel and the third pixel may display different colors. The second pixel and the fourth pixel may display different colors.

The first arc may be opposite the second arc.

A luminance of a color displayed by the first pixel may be higher than a luminance of a color displayed by the third pixel.

The first pixel may display a green color. The third pixel may display one of a red color and a blue color.

The second pixel may display a blue color. The fourth pixel may display the blue color.

The display device may include the following elements: a substrate on which the first pixel, the second pixel, the third pixel, and the fourth pixel are be disposed; a first color filter overlapping the first pixel in a direction vertical to the substrate; and a second color filter overlapping the third pixel in the direction vertical to the substrate. The first color filter may partially overlap the black member in the direction vertical to the substrate.

The second color filter may not overlap the black member in the direction vertical to the substrate.

Both the first pixel and the second pixel may be positioned in a first pixel row of the display device. Both the third pixel and the fourth pixel may be positioned in a second pixel row of this display device.

DETAILED DESCRIPTION OF EMBODIMENTS

Figure 1:
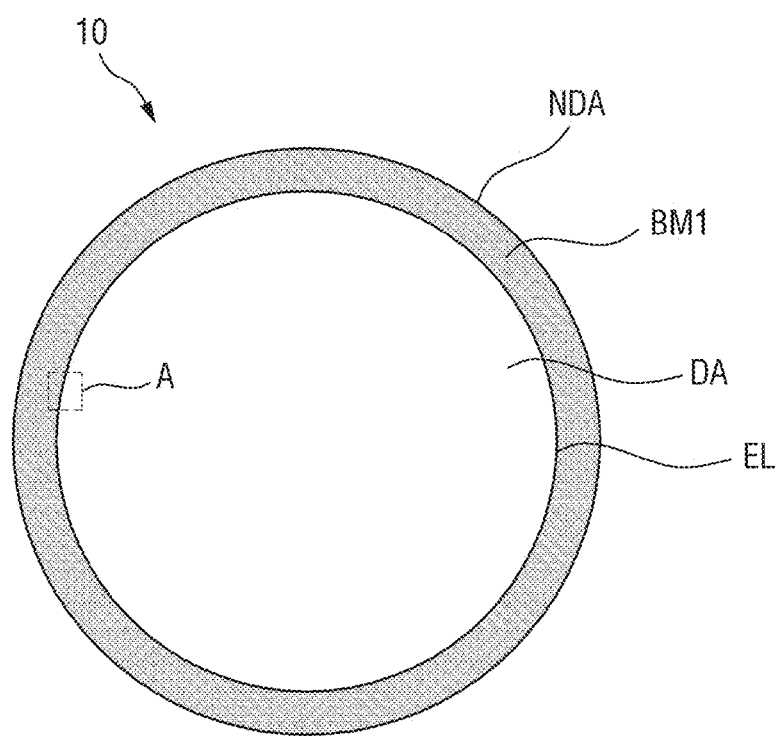
FIG. 1 is a plan view schematically showing a display device according to an embodiment.

Example embodiments are described with references to the drawings. Various embodiments may be practiced with variations to the described embodiments and/or with one or more equivalent arrangements.

In the accompanying figures, sizes of layers, films, panels, regions, etc., may be exaggerated for clarity and descriptive purposes. Like reference numerals may denote like elements.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-type (or first-set)", "second-type (or second-set)", etc., respectively.

When a first element is referred to as being "on," "connected to," or "coupled to" a second element, the first element may be directly on, directly connected to, or directly coupled to the second element, or one or more intervening elements may be present between the first element and the second element. When a first element is referred to as being "directly on," "directly connected to," or "directly coupled to" a second element, there are no intended intervening elements (except environmental elements such as air) present or connected between the first element and the second element. The term "and/or" may include any and all combinations of one or more of the associated items.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms may encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" may include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups.

Various embodiments are described herein with reference to sectional illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

The term "black matrix" may mean "black member".

FIG. 1 is a plan view schematically showing a display device 10 according to an embodiment.

Referring to FIG. 1, the display device 10 includes a display area DA and a non-display area NDA.

The display area DA is defined as an area where an image is displayed. The display area DA may have a curved boundary and/or may have a round shape. For example, the round shape may be a circular shape or an elliptical shape. The non-display area NDA is defined by a first black matrix BM1 (or black member BM1). The non-display area NDA may surround an outer periphery of the display area DA. Thus, the non-display area NDA may have a curved boundary and/or may have a round shape corresponding to the shape of the display area DA. The display area DA may be separated from the non-display area NDA by a boundary line EL.

In an embodiment, the non-display area NDA may have a rectangular shape. That is, the shape of the non-display area NDA is not limited to that shown in FIG. 1. In the plan view of the display device 10, the first black matrix BM1 may have an inner boundary and an outer boundary. The inner boundary may include one or more arcs (and/or curves) and may be surrounded by the outer boundary. The outer boundary may include one or more arcs.

Figure 2:
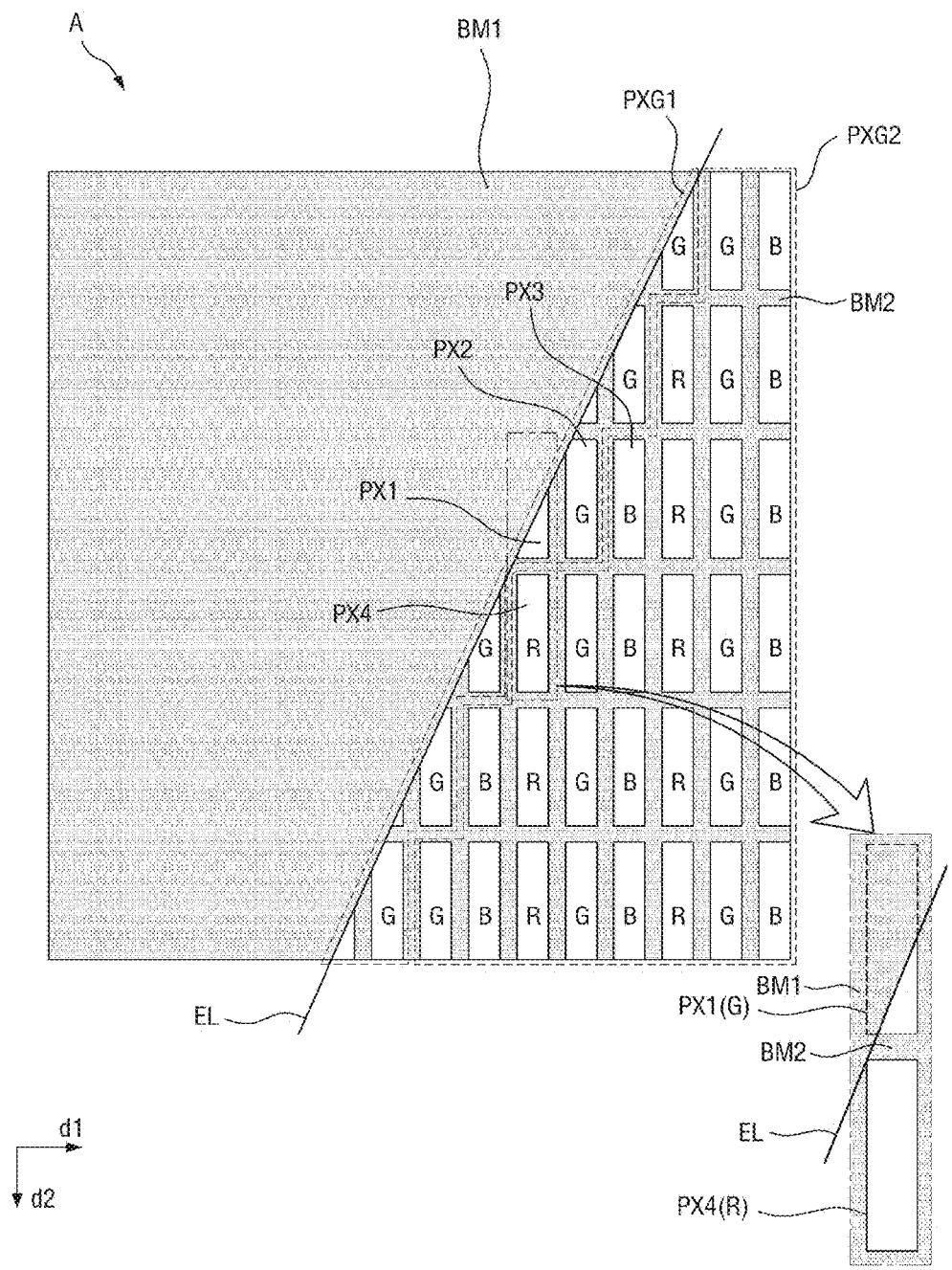
FIG. 2 is an enlarged view of region A shown in FIG. 1 according to an embodiment.

FIG. 2 is an enlarged view of region A shown in FIG. 1. For convenience of explanation, pixels are denoted by R, G and B if the colors displayed by the pixels are red, green and blue, respectively. In an embodiment, the color displayed by a pixel may be one of cyan, magenta, yellow, etc. In FIG. 2, portions of some pixels are covered by the first black matrix BM1.

Referring to FIG. 2, a plurality of pixels including pixels PX1, PX2, PX3, and PX4 may be completely or partially disposed in the display area DA. In an embodiment, the plurality of pixels may be included and/or categorized in a first pixel group PXG1 and a second pixel group PXG2.

The first pixel group PXG1 is defined as a set of pixels intersected by (an arch of) the inner boundary line EL of the first black matrix BM1 in the plan view of the display device 10. In other words, pixels included in the first pixel group PXG1 are at least partially covered by the first black matrix BM1. The plurality of pixels included in the first pixel group PXG1 may display a color having a relatively high luminance. In an embodiment, the color having a high luminance may be green. That is, the plurality of pixels included in the first pixel group PXG1 may display a green color. As used herein, the term "overlapping" means that two components at least partially overlap (and/or are positioned over) each other in a direction vertical to (a bottom face of) a lower substrate 110 (see FIG. 4).

The second pixel group PXG2 is defined as a set of pixels spaced from and/or not intersected by the boundary line EL in the plan view of the display device 10. In other words, pixels included in the second pixel group PXG2 are not covered by the first black matrix BM1. The pixels included in the second pixel group PXG2 may display red, green, and blue. In an embodiment, pixels included in the second pixel group PXG2 (and in a same pixel row) may repeat to display red, green, and blue colors along a first direction d1. Pixels included in the second pixel group PXG2 and positioned in a same pixel column (extending in a second direction d2) may display a same color. In FIG. 2, the first direction d1 is a row direction, and the second direction d2 is a column direction.

The first pixel PX1 and the fourth pixel PX4 are described by way of example. The first pixel PX1 and the fourth pixel PX4 are arranged in the same column and immediate neighbor each other. The first pixel PX1 is intersected by the boundary line EL and is partially covered by the first black matrix BM1. That is, the first pixel PX1 is included in the first pixel group PXG1. On the other hand, the fourth pixel PX4 is spaced from the boundary line EL and is not covered by the first black matrix BM1. That is, the fourth pixel PX4 is included in the second pixel group PXG2.

In an embodiment, the first pixel PX1 and the fourth pixel PX4 display different colors. More specifically, the color displayed by the first pixel PX1 has a higher luminance than the color displayed by the fourth pixel PX4. Thus, a complementary color phenomenon potentially occurring in the first pixel PX1 partially covered by the first black matrix BM1 can be alleviated. The color displayed by the first pixel PX1 may be green. The color displayed by the fourth pixel PX4 may be the same as the color displayed by the other second-pixel-group pixels arranged in the same column as the fourth pixel PX4. That is, the color displayed by the fourth pixel PX4 may be red. In an embodiment, the fourth pixel PX4 and the other second-pixel-group pixels arranged in the same column as the fourth pixel PX4 may display a blue color. If an embodiment, the fourth pixel PX4 and the other second-pixel-group pixels arranged in the same column as the fourth pixel PX4 may display the green color, and the first pixel PX1 may display the same color as the fourth pixel PX4.

Figure 3:
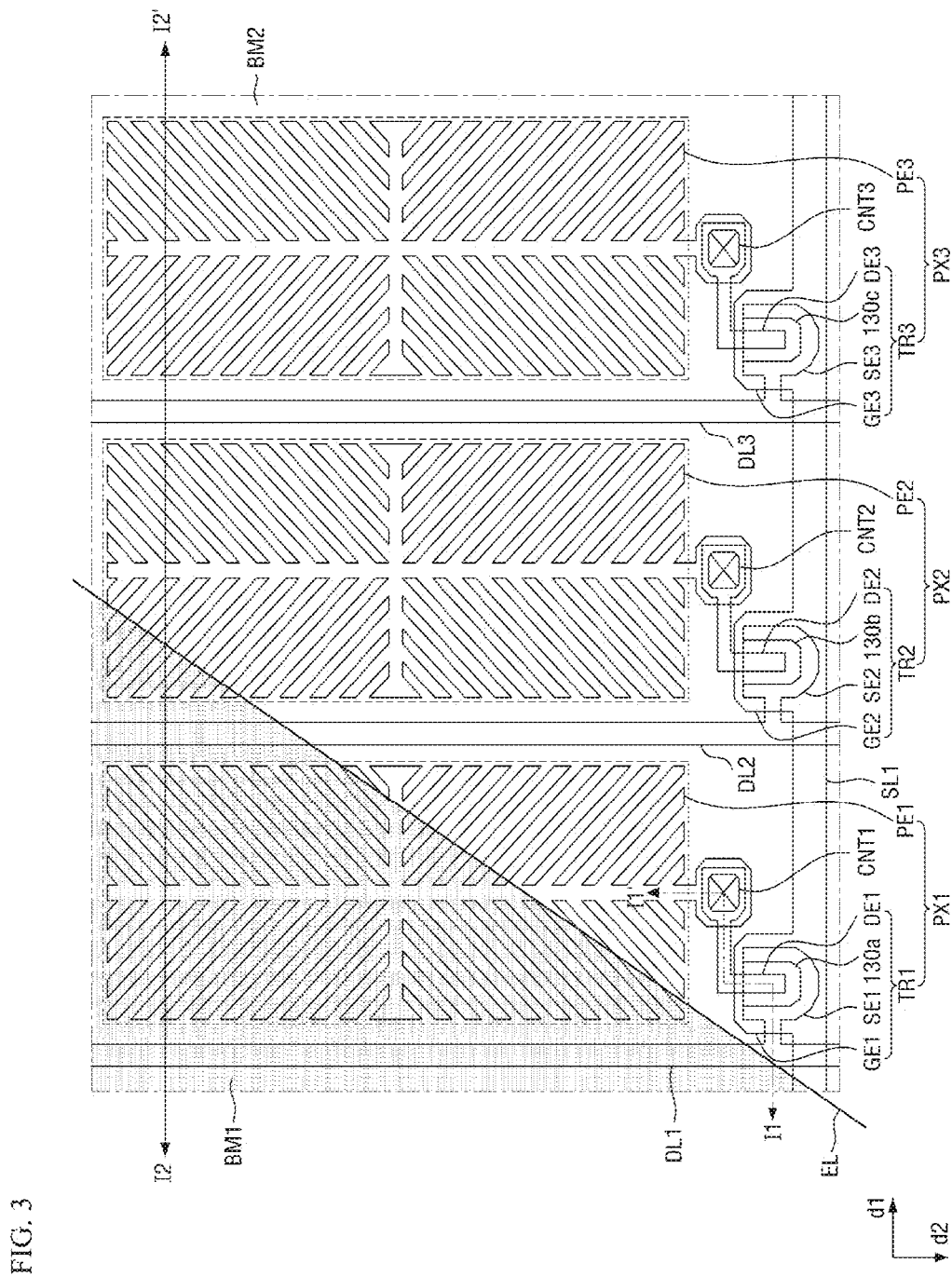
FIG. 3 is a layout diagram showing three pixels shown in FIG. 2 according to an embodiment.
Figure 4:
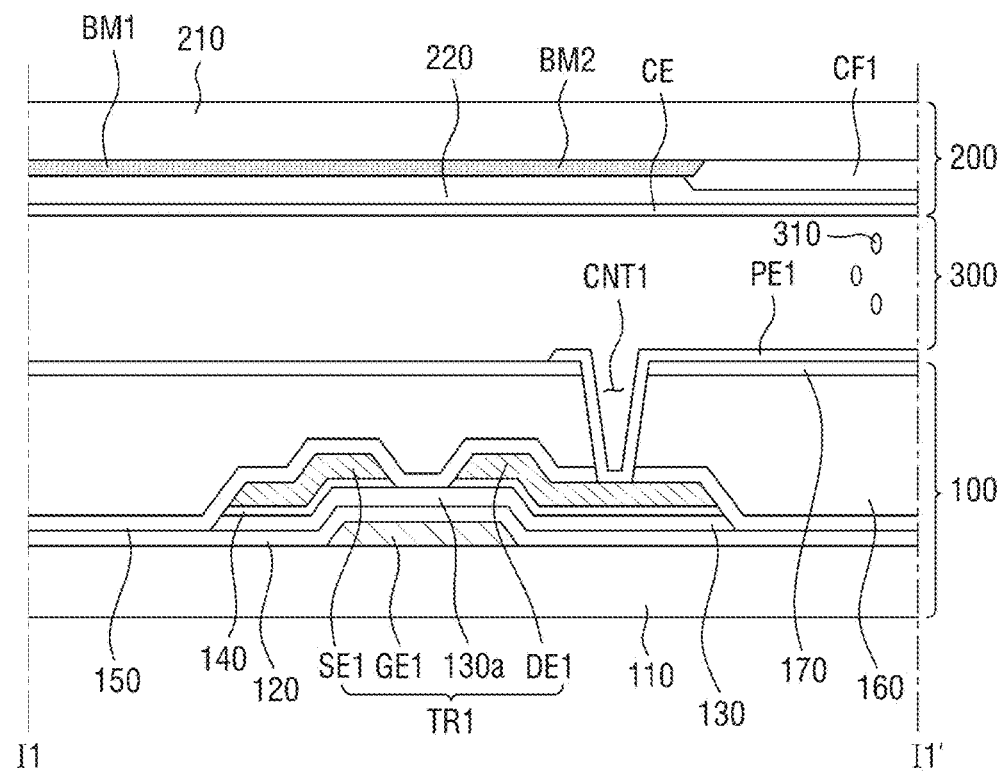
FIG. 4 is a cross-sectional view taken along line I1-I1' shown in FIG. 3 according to an embodiment.
Figure 5:
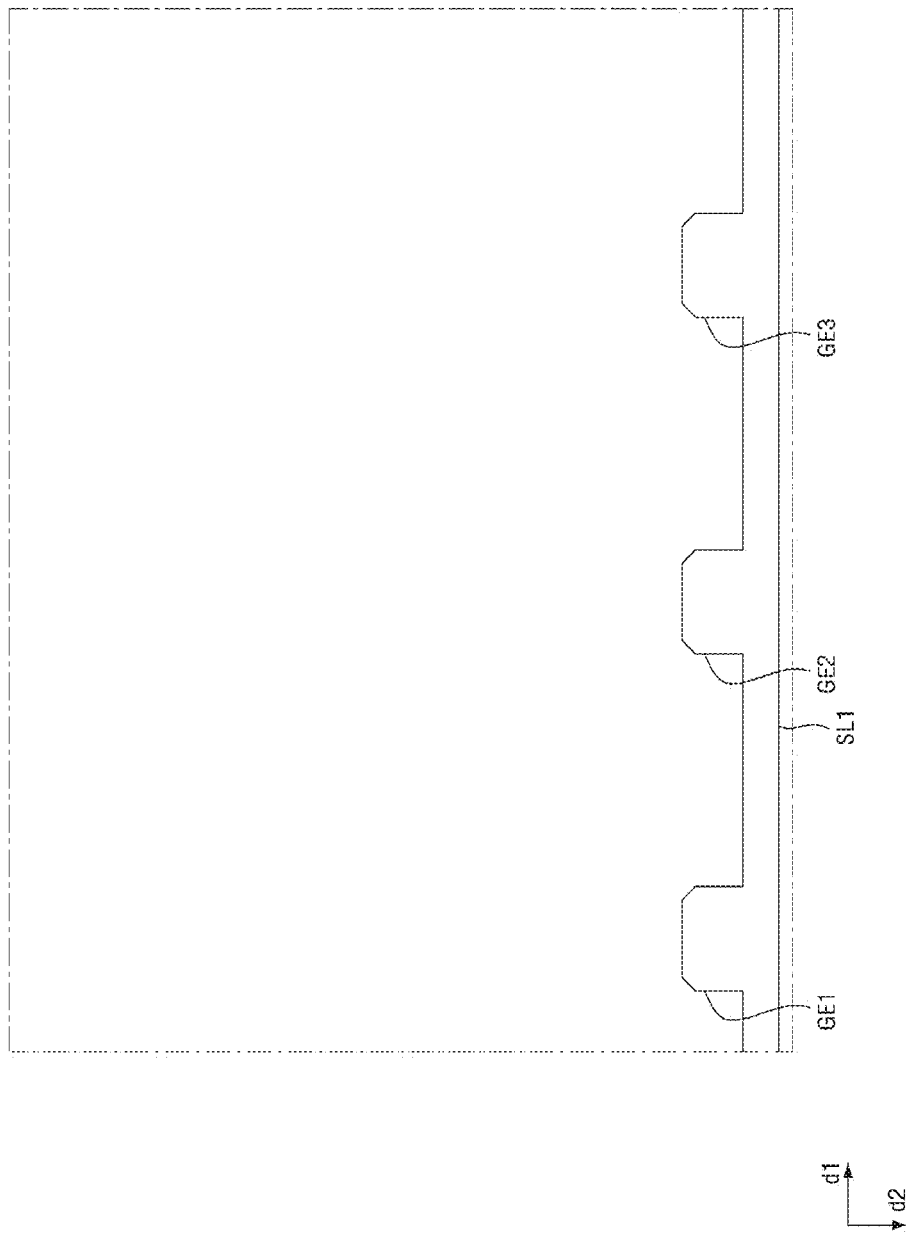
FIG. 5 illustrates a gate conductor shown in FIG. 3 according to an embodiment.
Figure 6:
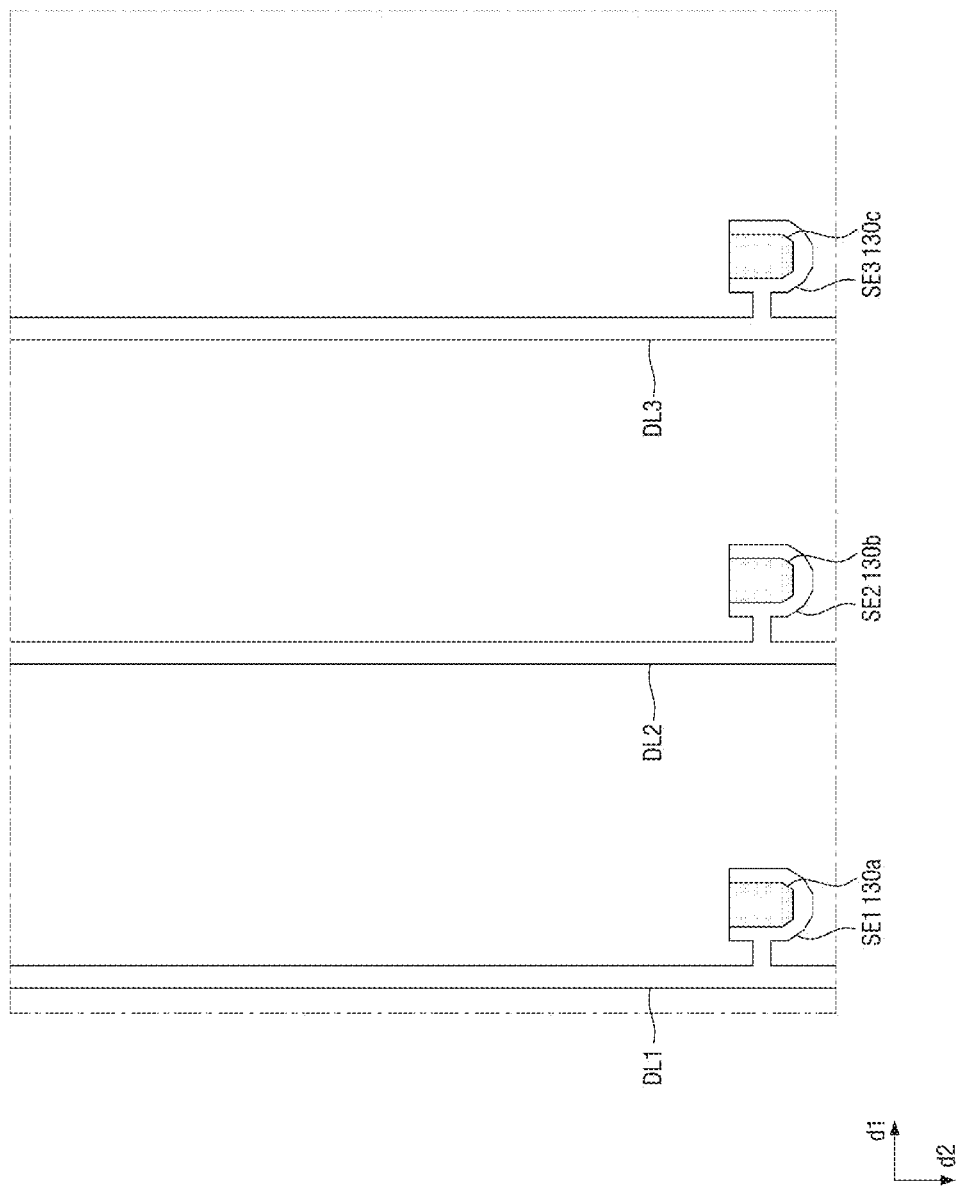
FIG. 6 illustrates a data conductor shown in FIG. 3 according to an embodiment.

FIG. 3 is a layout diagram showing pixels PX1, PX2, and PX3 shown in FIG. 2 according to an embodiment. FIG. 4 is a cross-sectional view taken along line I1-I1' shown in FIG. 3. FIG. 5 illustrates a gate conductor shown in FIG. 3. FIG. 6 illustrates a data conductor shown in FIG. 3. A liquid crystal display device is described as an example for the display device 10. In FIG. 3, a second black matrix BM2 is indicated by dotted lines in order to facilitate distinction from the first black matrix BM1.

Referring to FIG. 3, the pixels PX1, PX2, and PX3 may be disposed in the same pixel row and disposed adjacent to each other along the first direction d1.

The first pixel PX1 is intersected by (and partially overlaps) the boundary line EL. Further, the first pixel PX1 partially overlaps (and is partially covered by) the first black matrix BM1. The second pixel PX2 partially overlaps the boundary line EL. The second pixel PX2 partially overlaps the first black matrix BM1. That is, the first pixel PX1 and the second pixel PX2 are included in the first pixel group PXG1.

The third pixel PX3 is spaced from (and does not overlap) the boundary line EL and the first black matrix BM1. That is, the third pixel PX3 is included in the second pixel group PXG2.

The display area DA may at least partially overlap the second black matrix BM2. The second black matrix BM2 is disposed between immediately adjacent pixels in the display area DA.

The first pixel PX1 may include a first switching element TR1 and a first pixel electrode PE1. The first switching element TR1 may be electrically connected to a first scan line SL1, a first data line DL1 and the first pixel electrode PE1. The first switching element TR1 may perform a switching operation according to a signal supplied from the first scan line SL1 to provide a signal supplied from the first data line DL1 to the first pixel electrode PE1. In an embodiment, the first switching element TR1 and the first pixel electrode PE1 may be located on a lower display panel 100.

The lower display panel 100 may face an upper display panel 200. A liquid crystal layer 300 may be interposed between the lower display panel 100 and the upper display panel 200. The liquid crystal layer 300 may include a plurality of liquid crystal molecules 310. The lower display panel 100 may be bonded to the upper display panel 200 through a sealing element.

The lower substrate 110 may be a transparent insulating substrate. In an embodiment, the transparent insulating substrate may include a glass substrate, a quartz substrate, a transparent resin substrate, or the like. The lower substrate 110 may be flexible.

A gate conductor (see FIG. 5) may be disposed on the lower substrate 110. The gate conductor may include a first scan line SL1, a first gate electrode GE1, a second gate electrode GE2 and a third gate electrode GE3. The first scan line SL1 may extend in the first direction d1 on the lower substrate 110.

The first gate electrode GE1, the second gate electrode GE2 and the third gate electrode GE3 are disposed on the lower substrate 110 and connected to the first scan line SL1. The first gate electrode GE1, the second gate electrode GE2 and the third gate electrode GE3 may be formed to protrude from the first scan line SL1.

The gate conductor may be a single layer made of a material selected from conductive metals including aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi), a double layer made of at least two materials selected therefrom, or a triple layer made of three materials selected from the above conductive metals. The parts of the gate conductor may be formed simultaneously through the same mask process.

A gate insulating film 120 may be disposed on the gate conductor. The gate insulating film 120 may be formed of silicon nitride (SiNx), silicon oxide (SiOx) or the like. The gate insulating film 120 may have a multilayer structure including at least two insulating layers having different physical properties.

A data conductor (see FIG. 6) may be disposed on the gate insulating film 120. The data conductor may include a first data line DL1, a second data line DL2, a third data line DL3, a first source electrode SE1, a first drain electrode DE1, a second source electrode SE2, a third source electrode SE3 and a third drain electrode DE3.

The semiconductor layer 130 may include channel regions 130a, 130b, and 130c forming channels of the switching elements TR1, TR2, and TR3. The semiconductor layer 130 may include amorphous silicon or polycrystalline silicon. In an embodiment, the semiconductor layer 130 may include an oxide semiconductor. In an embodiment, the oxide semiconductor may be one of IGZO (In-Ga-Zinc-Oxide), ZnO, $ZnO_2$, CdO, SrO, $SrO_2$, CaO, $CaO_2$, MgO, $MgO_2$, InO, $In_2O_2$, GaO, $Ga_2O$, $Ga_2O_3$, SnO, $SnO_2$, GeO, $GeO_2$, PbO, $Pb_2O_3$, $Pb_3O_4$, TiO, $TiO_2$, $Ti_2O_3$, and $Ti_3O_5$.

The switching elements (e.g., the switching element TR1) may further include an ohmic contact layer 140. The ohmic contact layer 140 may be disposed on the semiconductor layer 130. The ohmic contact layer 140 may be made of a material such as n+ hydrogenated amorphous silicon, which is doped with n-type impurities such as phosphorus in high concentration, or may be made of silicide. However, the ohmic contact layer 140 may be unnecessary if the semiconductor layer 130 is formed of an oxide semiconductor.

The first data line DL1, the second data line DL2, the third data line DL3, the first source electrode SE1, the first drain electrode DE1, the second source electrode SE2, the second drain electrode DE2, the third source electrode SE3 and the third drain electrode DE3 may be disposed on the gate insulating film 120 and the ohmic contact layer 140. The first to third data lines DL1 to DL3 may be disposed adjacent to each other and may extend in the second direction d2 on the lower substrate 110.

The first source electrode SE1 may be branched from the first data line DL1 so that the first source electrode SE1 at least partially overlaps the first gate electrode GE1 in the direction vertical to the lower substrate 110. The first drain electrode DE1 may be spaced from the first source electrode SE1 by a predetermined distance while overlapping the first gate electrode GE1 in the direction vertical to the lower substrate 110. Illustrated in FIG. 3, the first source electrode SE1 has a U shape, and the first drain electrode DE1 is surrounded by the first source electrode SE1. The electrodes SE1 and DE1 may have other structures.

The first source electrode SE1 and the first drain electrode DE1 form the first switching element TR1 together with the first gate electrode GE1 and the first channel region 130a of the semiconductor layer 130. The first source electrode SE1 of the first switching element TR1 may be connected to the first data line DL1. The first drain electrode DE1 of the first switching element TR1 may be connected to the first pixel electrode PE1, which will be described later, through a first contact hole CNT1.

The data conductor may be a single layer made of a material selected from conductive metals including aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi), a double layer made of at least two materials selected therefrom, or a triple layer made of three materials selected from the above conductive metals. The data conductor may be made of other conductors. The parts of the data conductor may be formed simultaneously through the same mask process.

A first passivation film 150 may be disposed on the first data line DL1, the second data line DL2, the third data line DL3, the first source electrode SE1, the first drain electrode DE1, the second source electrode SE2, the second drain electrode DE2, the third source electrode SE3 and the third drain electrode DE3. The first passivation film 150 may be formed of an inorganic insulating material such as silicon nitride and/or silicon oxide. The first passivation film 150 can prevent a pigment of an organic insulating film 160 from flowing into the channel region 130a.

The organic insulating film 160 may be disposed on the first passivation film 150. The organic insulating film 160 may include an organic material having excellent planarization characteristics and photosensitivity. The organic insulating film 160 may be omitted.

A second passivation film 170 may be disposed on the organic insulating film 160. The second passivation film 170 may be formed of an inorganic insulating material such as silicon nitride and/or silicon oxide. The second passivation film 170 can prevent the organic insulating film 160 from coming off and prevent the liquid crystal layer 300 from being contaminated by a substance such as a solvent flowing from the organic insulating film 160.

In the first passivation film 150, the organic insulating film 160, and the second passivation film 170, contact holes CNT1, CNT2, and CNT3, which at least partially expose the drain electrodes DE1, DE2, and DE3, respectively, may be formed.

The pixel electrodes PE1, PE2, and PE3 may be disposed on the second passivation film 170. The pixel electrodes PE1 to PE3 may be formed of a transparent conductive material such as ITO and/or IZO, or a reflective metal such as aluminum, silver, chromium, or an alloy of metals. The pixel electrodes PE1 to PE3 are in contact with the drain electrodes DE1 to DE3, which are exposed through the contact holes CNT1 to CNT3, respectively.

Although not shown in the drawings, a shielding electrode may be disposed on the same layer as the pixel electrodes PE1 to PE3. The shielding electrode may be formed of a transparent conductive material such as ITO and/or IZO, or a reflective metal such as aluminum, silver, chromium, or an alloy. The shielding electrode may be formed at the same time through the same mask process as the pixel electrodes PE1 to PE3.

Although not shown in the drawings, a first alignment film may be disposed on the pixel electrodes PE1 to PE3 and the shielding electrode. The first alignment film may be formed of polyimide or the like.

An upper substrate 210 faces the lower substrate 110. The upper substrate 210 may be formed of transparent glass, plastic, or the like, and may be formed of the same material as the lower substrate 110.

The first black matrix BM1 and the second black matrix BM2 may be disposed on the upper substrate 210. The first black matrix BM1 and the second black matrix BM2 may be disposed on the same layer. The first black matrix BM1 and the second black matrix BM2 may be formed by the same mask process. That is, the first black matrix BM 1 and the second black matrix BM 2 are formed on the same layer using the same material, and can be separated from each other by the boundary line EL. The first black matrix BM1 and the second black matrix BM2 are configured to block transmission of light. The first black matrix BM1 and the second black matrix BM2 may be formed of an organic material or a metallic material containing chromium.

Color filters CF1, CF2, and CF3 may be disposed on one or more of the black matrices BM1 and BM2. The first color filter CF1 may include a green pigment. Accordingly, the light passing through the first color filter CF1 displays a green color. The second color filter CF2 may include a red pigment. Accordingly, the light passing through the second color filter CF2 displays a red color. The third color filter CF3 may include a blue pigment. Accordingly, the light passing through the third color filter CF3 displays a blue color.

A planarization layer 220 may be disposed on the color filters CF1 to CF3, the first black matrix BM1 and the second black matrix BM2. The planarization layer 220 may planarize local steps due to components disposed between the planarization layer 220 and the upper substrate 210. The planarization layer 220 may be formed of an insulating material, and may be unnecessary in some embodiments.

A common electrode CE may be disposed on the planarization layer 220. The common electrode CE may overlap the pixel electrodes PE1 to PE3 in the direction vertical to the lower substrate 110. The common electrode CE may be formed of a transparent conductive material such as ITO and/or IZO, or a reflective metal such as aluminum, silver, chromium, or an alloy.

Figure 7:
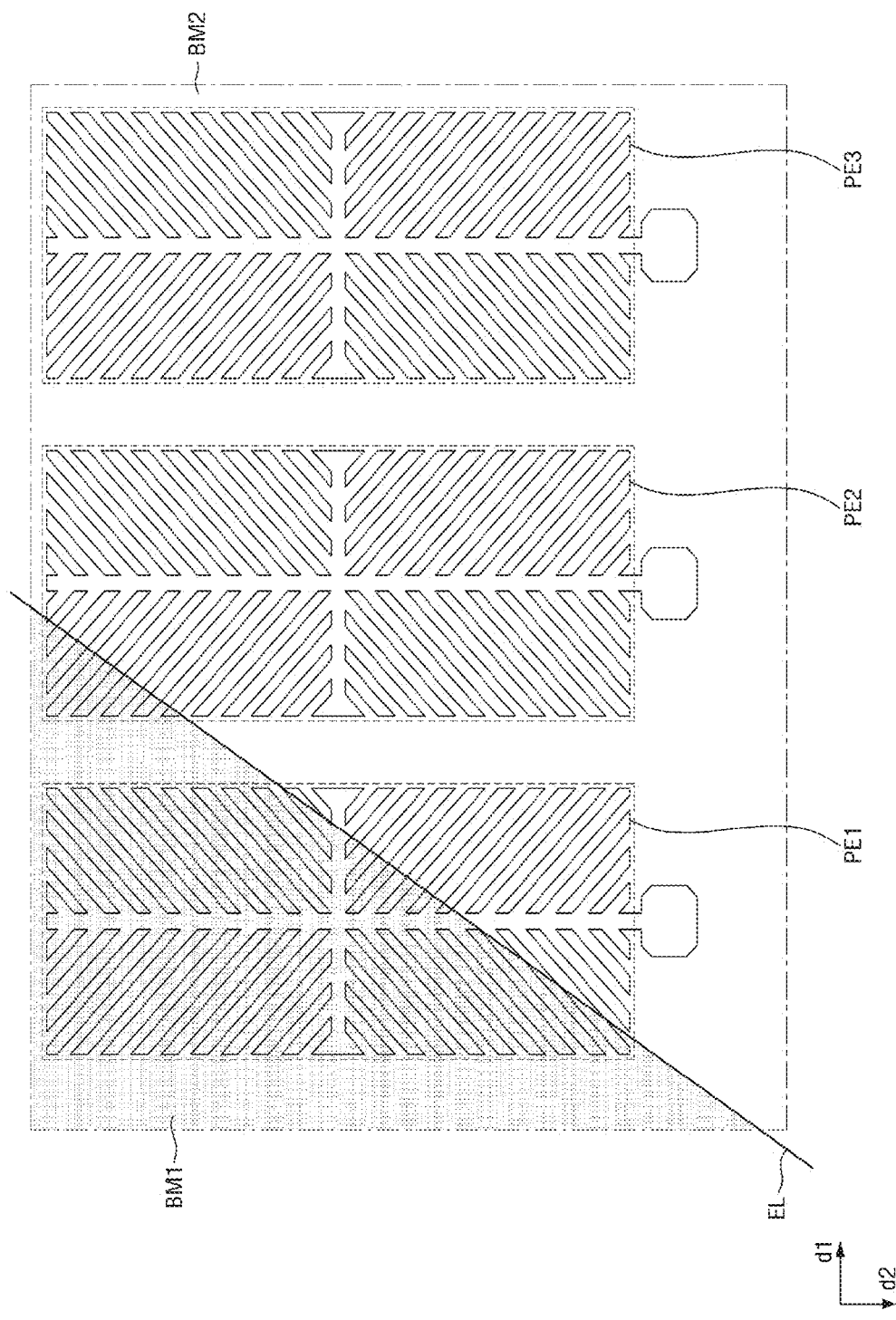
FIG. 7 is a diagram showing the three pixel electrodes, the first black matrix and the second black matrix shown in FIG. 3 according to an embodiment.
Figure 8:
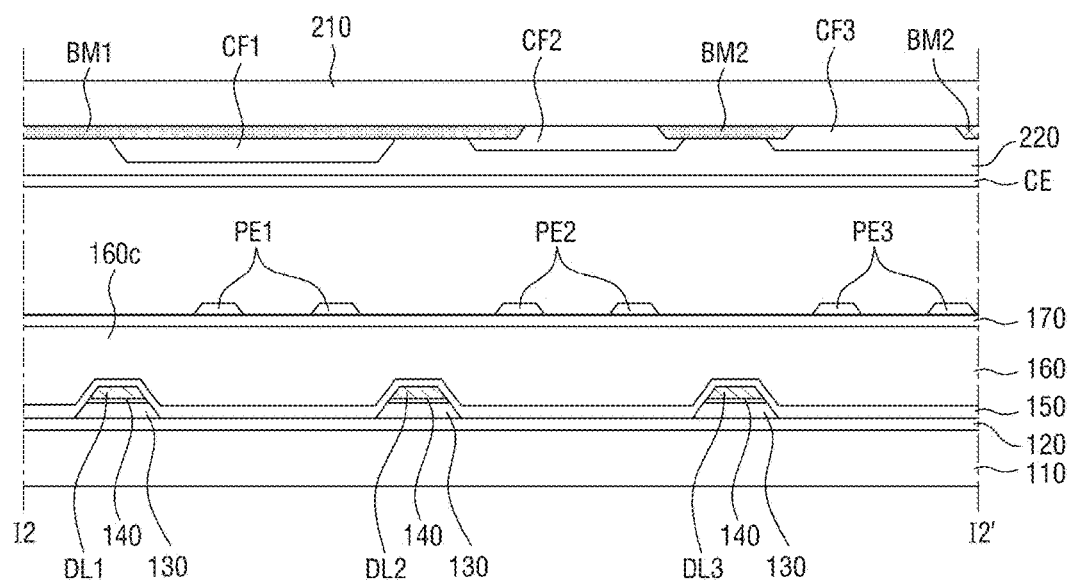
FIG. 8 is a cross-sectional view taken along line I2-I2' shown in FIG. 3 according to an embodiment.

FIG. 7 is a diagram showing the pixel electrodes PE1, PE2, and PE3, the first black matrix BM1, and the second black matrix BM2 shown in FIG. 3 according to an embodiment. FIG. 8 is a cross-sectional view taken along line I2-I2' shown in FIG. 3 according to an embodiment. In FIG. 8, the slits of the pixel electrodes PE1 to PE3 are denoted by wave lines (~).

Referring to FIGS. 7 and 8, the first pixel unit PX1 and the second pixel unit PX2 overlap the boundary line EL.

Specifically, the first pixel PX1 at least partially overlaps the first black matrix BM1.

More specifically, a part of the first pixel electrode PE1 of the first pixel PX1 overlaps the first black matrix BM1. In other words, a part of the first pixel electrode PE1 is covered by the first black matrix BM1. Accordingly, the first pixel electrode PE1 displays a color only in a portion not covered by the first black matrix BM1. In an embodiment, the first pixel PX1 may display a green color. The first pixel electrode PE1 may overlap the first color filter CF1 including the green pigment.

A part of the second pixel electrode PE2 of the second pixel PX2 overlaps the first black matrix BM1. In an embodiment, the second pixel PX2 may display a red color. The second pixel electrode PE2 may overlap the second color filter CF2 including the red pigment.

The third pixel electrode PE3 of the third pixel PX3 does not overlap the first black matrix BM1. In an embodiment, the third pixel PX3 may display a blue color. The third pixel PX3 may display the same color as the other second-pixel-group pixels arranged in the same column. The third pixel electrode PE3 may overlap the third color filter CF3 including the blue pigment.

The pixels PX1 and PX2 are included in the first pixel group PXG1 described above. On the other hand, the third pixel PX3 is included in the second pixel group PXG2 described above.

In an embodiment, pixels having a relatively high luminance (e.g., green pixels) may be partially covered by the first black matrix BM1 and intersected by curved boundary sections of the first black matrix BM1. Advantageously, an undesirable complementary color phenomenon associated with the first black matrix BM1 can be alleviated. Thus, an undesirable staircase phenomenon in which the boundary line EL appears like a staircase can be alleviated.

In an embodiment, the second black matrix BM2 can prevent light leakage in a region other than pixel regions, for correctly displaying colors. The second black matrix BM2 may overlap the switching elements TR1 to TR3, the first scan line SL1, and the data lines DL1 to DL3.

In an embodiment, the pixels included in the first pixel group PXG1 may display magenta or another color. The plurality of pixels included in the second pixel group PXG2 may display cyan, magenta, yellow and/or other colors.

In an embodiment, the color filters CF1 to CF3 may be disposed on the lower substrate 110, e.g., on the first passivation film 150.

Figure 9A:
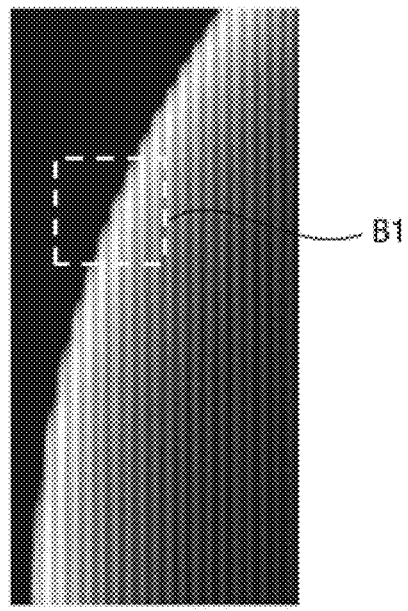
FIG. 9A and FIG. 9B are diagram showing improvement of one or more staircase phenomena according to one or more embodiments.
Figure 9B:
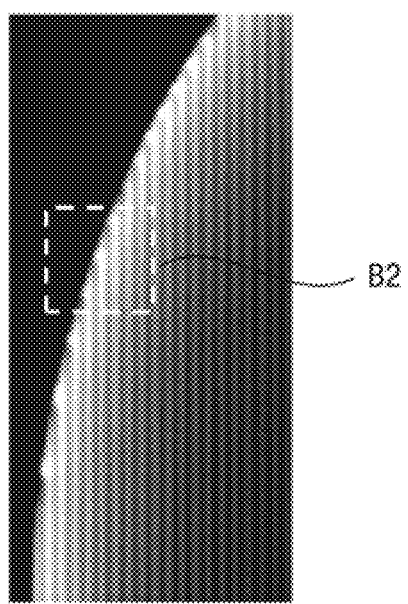

FIG. 9A and FIG. 9B are diagrams showing improvement of one or more staircase phenomena according to one or more embodiments. FIG. 9A shows a state of a first circular display device when observed at a viewing distance of about 50 cm, and FIG. 9B shows a state of a second circular display device according to an embodiment when observed at a viewing distance of about 50 cm.

Comparing region B1 shown in FIG. 9A with region B2 shown in FIG. 9B, it can be seen that a staircase phenomenon in region B2 is less conspicuous than that in region B1.

Figure 10:
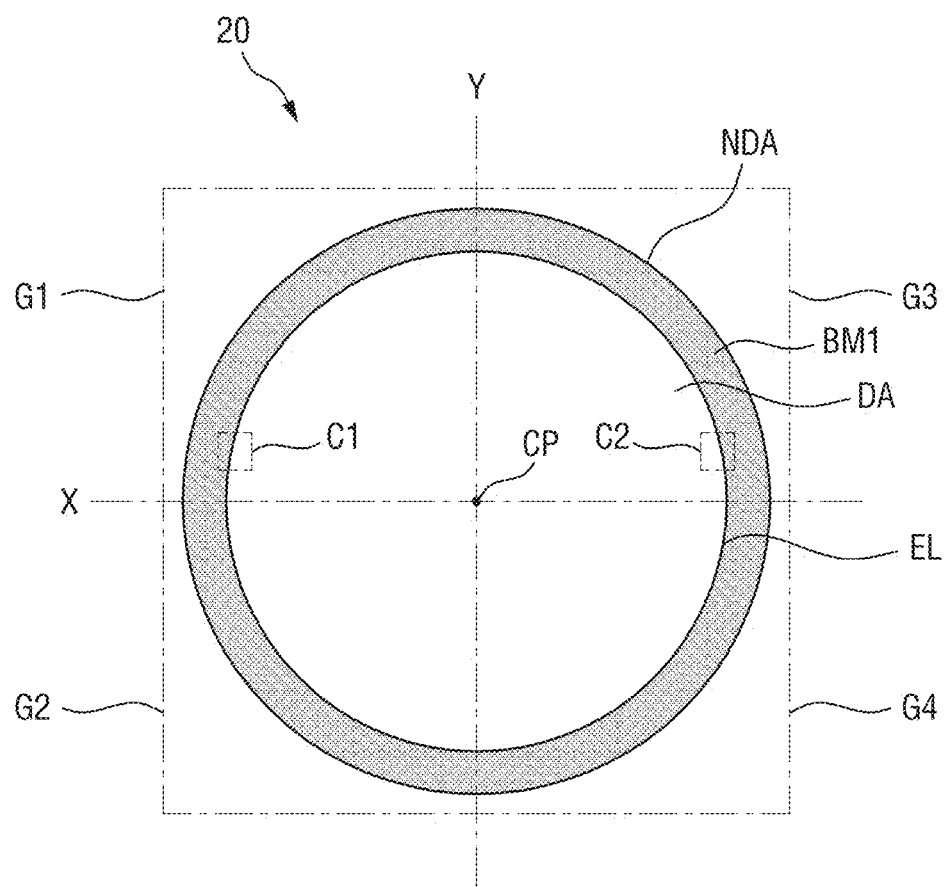
FIG. 10 is a plan view showing a display device according to an embodiment.
Figure 11:
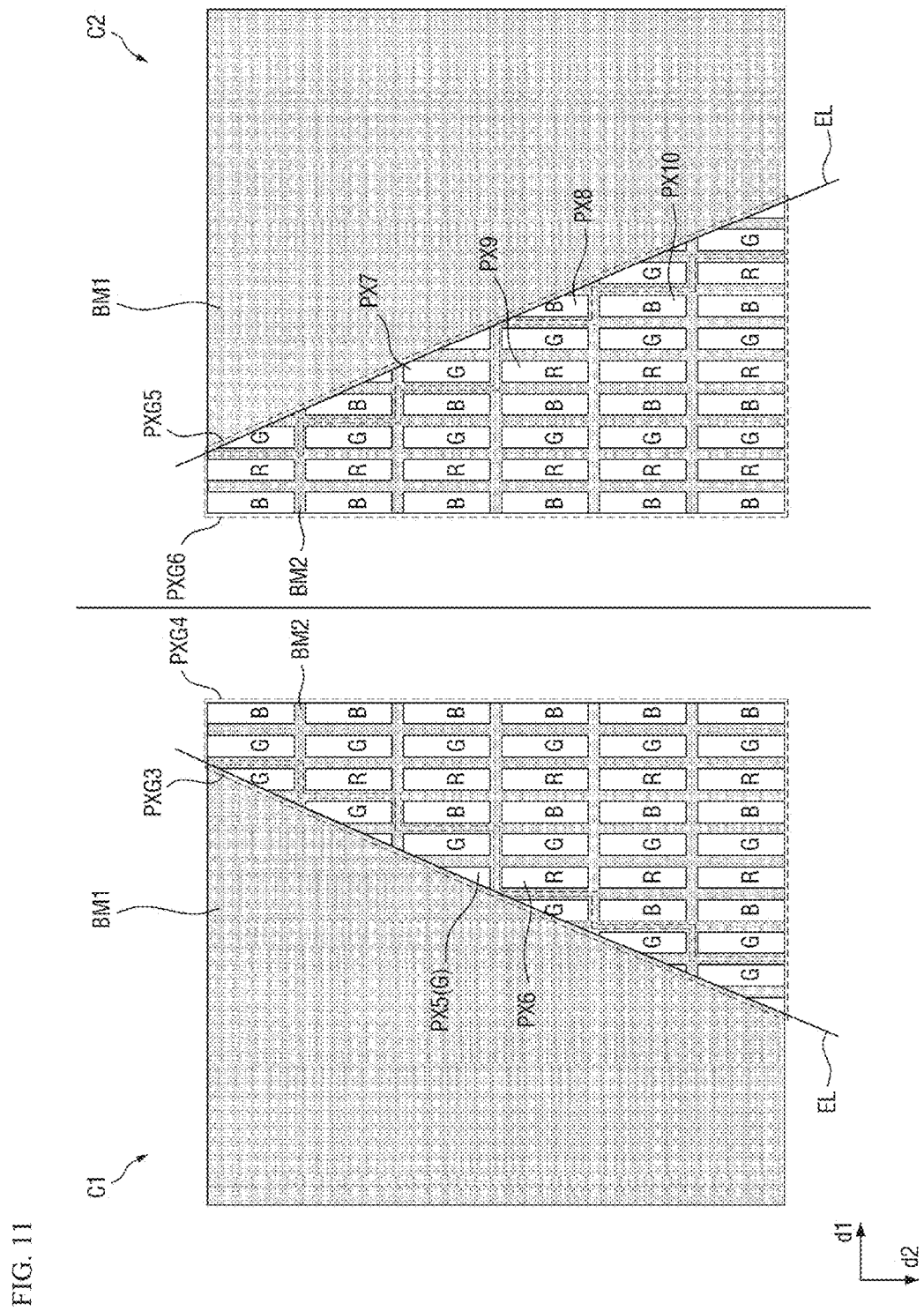
FIG. 11 is an enlarged view of regions C1 and C2 shown in FIG. 10.

FIG. 10 is a plan view showing a display device 20 according to an embodiment. FIG. 11 is an enlarged view of regions C1 and C2 shown in FIG. 10. Description for elements of the display device 20 similar to or identical to elements of the display device 10 described with reference to FIGS. 1 to 9 may not be repeated.

Referring to FIGS. 10 and 11, the display device 20 may be divided into regions G1, G2, G3, and G4 by an X-axis and a Y-axis. In an embodiment, both the X-axis and the Y-axis pass through the center point CP of the display area DA and/or of the first black matrix BM1 (or first black member BM1).

A third pixel group PXG3 and a fourth pixel group PXG4 may be disposed in the regions G1 and G2 of the display area DA. The third pixel group PXG3 is defined as a set of pixels at least partially covered by the first black matrix BM1 and interacted by the boundary line EL. The fourth pixel group PXG4 is defined as a set of pixels spaced from the boundary line EL and completely exposed by the first black matrix BM1. The pixels included in the third pixel group PXG3 may display a color having a higher luminance than colors displayed by some pixels included in the fourth pixel group PXG4 and the same color displayed by other pixels included in the fourth pixel group PXG4. The pixels included in the third pixel group PXG3 may display a green color. The pixels included in the fourth pixel group PXG4 may display red, green, and blue colors.

A fifth pixel group PXG5 and a sixth pixel group PXG6 may be disposed in the regions G3 and G4 of the display area DA. The fifth pixel group PXG5 is defined as a set of pixels which at least partially covered by the first black matrix BM1 and intersected by the boundary line EL. The sixth pixel group PXG6 is defined as a set of pixels spaced from the boundary line EL and completely exposed by the first black matrix BM1. Some pixels included in the fifth pixel group PXG5 may display a green color. The pixels included in the sixth pixel group PXG6 may display red, green, and blue colors.

More specifically, the third pixel group PXG3 may include a fifth pixel PX5. The fourth pixel group PXG4 may include a sixth pixel PX6. The fifth pixel PX5 be intersected by the boundary line EL and may be partially covered by the first black matrix BM1. The sixth pixel PX6 is spaced from both the boundary line EL and the first black matrix BM1 in the plan view of the display device 20. The fifth pixel PX5 and the sixth pixel PX6 are arranged in the same column and immediately neighbor each other.

The fifth pixel PX5 and the sixth pixel PX6 display different colors. More specifically, the color displayed by the fifth pixel PX5 has a higher luminance than the color displayed by the sixth pixel PX6. Thus, a complementary color phenomenon potentially occurring in the fifth pixel PX5, which is partially covered by the first black matrix BM1, can be alleviated. The color displayed by the fifth pixel PX5 may be green. The color displayed by the sixth pixel PX6 may be the same as the color displayed by the other fourth-pixel-group pixels arranged in the same column as the fifth pixel PX5.

The fifth pixel group PXG5 may include pixels PX7 and PX8. The sixth pixel group PXG6 may include pixels PX9 and PX10. The pixels PX7 and PX8 are intersected by the boundary line EL and are partially covered by the first black matrix BM1. The pixels PX9 and PX10 are spaced from both the boundary line EL and the first black matrix BM1 in the plan view of the display device 20.

The seventh pixel PX7 and the ninth pixel PX9 are arranged in the same column and immediately neighbor each other. The eighth pixel PX8 and the tenth pixel PX10 are arranged in the same column and immediately neighbor each other. The seventh pixel PX7 and the ninth pixel PX9 display different colors. The seventh pixel PX7 may display a green color, and the ninth pixel PX9 may display a red color. The eighth pixel PX8 may display the same color as the tenth pixel PX10. The eighth and tenth pixels PX8 and PX10 may both display a blue color.

In the display device 20, a pixel overlapping the first black matrix BM1 may display a color other than green depending on the position of the pixel in the display area DA. For example, in the first region G1, a pixel overlapping the first black matrix BM1 may display a green color. On the other hand, in the third region G3, a pixel overlapping the first black matrix BM1 may display a blue color if the sixth-pixel-group pixels arranged in the same column display a blue color, and may display a green color if the sixth-pixel-group pixels arranged in the same column display a red color or a green color.

Thus, since the pixels displaying a green color intervened with blue pixels, green pixels may not be excessively conspicuous.

In an embodiment, in the third region G3, a pixel overlapping the first black matrix BM1 may display a green color if the sixth-pixel-group pixels arranged in the same column display a blue color or a green color, and may display a red color if the sixth-pixel-group pixels arranged in the same column display a red color.

Although FIGS. 10 and 11 illustrate the first region G1 and the third region G3 as an example, the display colors of the pixels overlapping the first black matrix BM1 may be configured differently depending on the color displayed by the pixels completely exposed by the first black matrix BM1, the shape and size of the display area DA, and the like.

Figure 12:
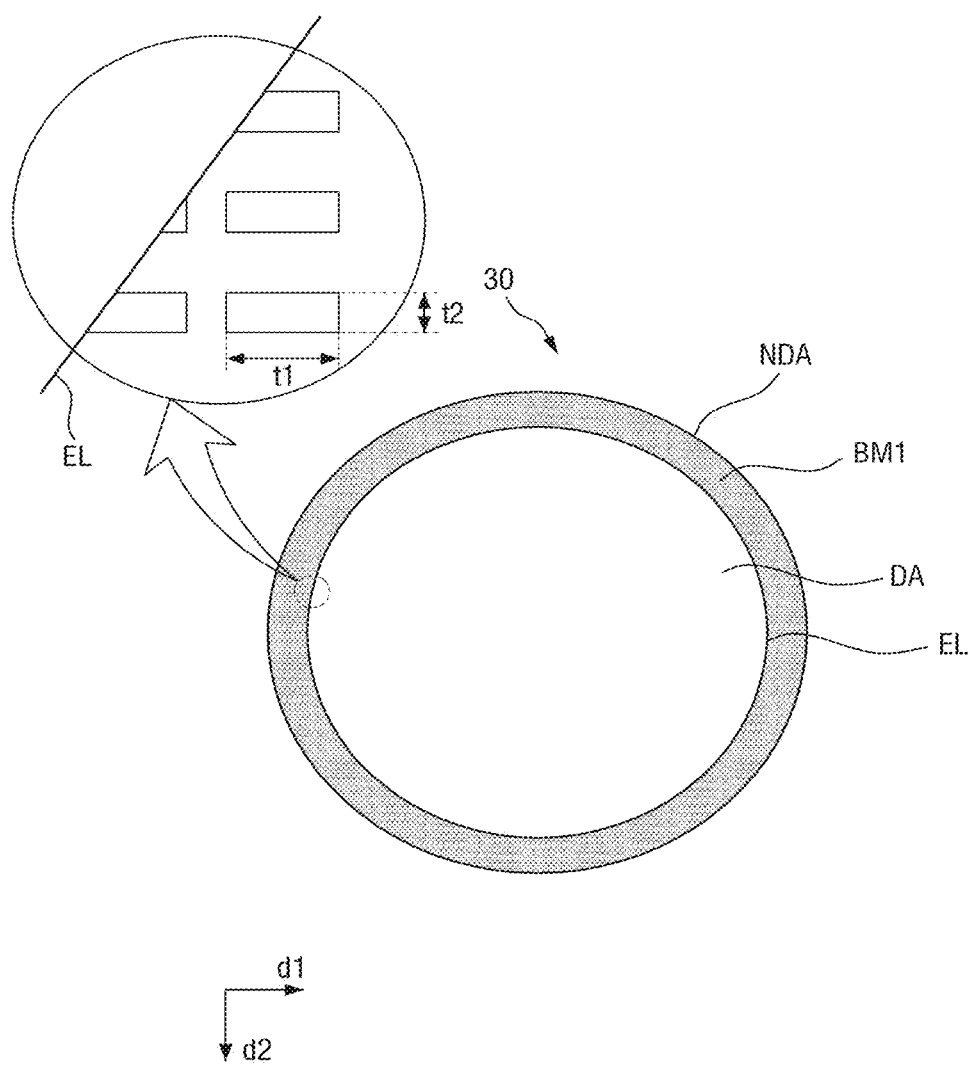
FIG. 12 is a plan view showing a display device according to an embodiment.

FIG. 12 is a plan view showing a display device 30 according to an embodiment. Description related to elements of the display device 30 similar to or identical to elements of the display device 10 and/or the display device 20 described with reference to FIGS. 1 to 11 may not be repeated.

Referring to FIG. 12, the display device 30 may include a plurality of pixel electrodes, each having a long side t1 extending in the first direction d1 and a short side t2 extending in the second direction d2. That is, the display device 30 may include a plurality of pixels having a plurality of horizontal pixel electrodes.

The display device according to an embodiment may be an organic light emitting display device. In an embodiment, a pixel at least partially covered by the first black matrix BM1 may emit light in a color having a higher luminance than a pixel arranged in the same pixel column as the pixel and completely exposed by the first black matrix BM1. For example, the pixel at least partially overlapping the first black matrix BM1 may include an organic light emitting element that emits green light. Further, the pixel arranged in the same pixel column as the above-described pixel and completely exposed by the first black matrix BM1 may include an organic light emitting element that emits red light or blue light.

What is claimed is:

1. A display device comprising:
   a black member having a first boundary and a second boundary in a plan view of the display device, wherein the first boundary includes a first arc and is surrounded by the second boundary;
   a first pixel comprising a first pixel electrode, displaying a first color, positioned in a first pixel column of the display device, and intersected by the first arc in the plan view of the display device; and
   a second pixel comprising a second pixel electrode, displaying a second color different from the first color, immediately neighboring the first pixel, positioned in the first pixel column of the display device, and spaced from the first boundary in the plan view of the display device,
   wherein the first pixel displays a green color or a magenta color, and
   wherein the second pixel displays one of a red color, a blue color, a cyan color, and a yellow color.

2. The display device of claim 1, wherein a luminance of the first color is higher than a luminance of the second color.

3. The display device of claim 1, wherein the first pixel displays a green color.

4. The display device of claim 3, wherein the second pixel displays a red color or a blue color.

5. The display device of claim 1, comprising:
   a substrate on which the first pixel and the second pixel are disposed;
   a first color filter overlapping the first pixel electrode in a direction vertical to the substrate; and
   a second color filter overlapping the second pixel electrode in the direction vertical to the substrate,
   wherein the first color filter partially overlaps the black member in the direction vertical to the substrate.

6. The display device of claim 5, wherein the second color filter does not overlap the black member in the direction vertical to the substrate.

7. The display device of claim 1, wherein the first boundary further includes a second arc opposite the first arc.

8. The display device of claim 7, further comprising:
   a third pixel comprising a third pixel electrode, positioned in a second pixel column of the display device, and intersected by the second arc in the plan view of the display device; and
   a fourth pixel comprising a fourth pixel electrode, immediately neighboring the third pixel, positioned in the second pixel column of the display device, and spaced from the first boundary in the plan view of the display device.

9. The display device of claim 8, wherein a luminance of a color displayed by the third pixel is higher than a luminance of a color displayed by the fourth pixel.

10. The display device of claim 8, wherein the third pixel displays a green color, and wherein the fourth pixel displays one of a red color and a blue color.

11. The display device of claim 8, wherein the third pixel and the fourth pixel display a same color.

12. The display device of claim 1, further comprising:
   a fifth pixel positioned in a third column of the display device and intersected by the first boundary in the plan view of the display device; and
   a sixth pixel immediately neighboring the fifth pixel, arranged in the third column of the display device, and completely exposed by the black member in the plan view of the display device,
   wherein the fifth pixel and the sixth pixel display a same color.

13. A display device comprising:
   a black member having a first boundary and a second boundary in a plan view of the display device, wherein the first boundary includes a first arc, includes a second arc, and is surrounded by the second boundary;
   a first pixel comprising a first pixel electrode, positioned in a first pixel column of the display device, and intersected by the first arc in the plan view of the display device;
   a second pixel comprising a second pixel electrode, positioned in a second pixel column of the display device, and intersected by the second arc in the plan view of the display device;
   a third pixel comprising a third pixel electrode, immediately neighboring the first pixel, positioned in the first pixel column of the display device, and spaced from the first boundary in the plan view of the display device; and
   a fourth pixel comprising a fourth pixel electrode, immediately neighboring the second pixel, positioned in the second pixel column of the display device, and spaced from the first boundary,
   wherein the first pixel and the third pixel display different colors, and wherein the second pixel and the fourth pixel display a same blue color.

14. The display device of claim 13, wherein the first arc is opposite the second arc.

15. The display device of claim 13, wherein a luminance of a color displayed by the first pixel is higher than a luminance of a color displayed by the third pixel.

16. The display device of claim 13, wherein the first pixel displays a green color, and wherein the third pixel displays one of a red color and a blue color.

17. The display device of claim 13, wherein the second boundary includes one or more arcs.

18. The display device of claim 13, comprising:
   a substrate on which the first pixel, the second pixel, the third pixel, and the fourth pixel are disposed;
   a first color filter overlapping the first pixel in a direction vertical to the substrate; and
   a second color filter overlapping the third pixel in the direction vertical to the substrate,
   wherein the first color filter partially overlaps the black member in the direction vertical to the substrate.

19. The display device of claim 18, wherein the second color filter does not overlap the black member in the direction vertical to the substrate.

20. The display device of claim 13, wherein both the first pixel and the second pixel are positioned in a first pixel row of the display device, and wherein both the third pixel and the fourth pixel are positioned in a second pixel row of this display device.

* * * * *